United States Patent
Murakami et al.

(10) Patent No.: US 6,621,106 B2
(45) Date of Patent: Sep. 16, 2003

(54) LIGHT EMITTING DIODE

(75) Inventors: Tetsuroh Murakami, Tenri (JP); Takahisa Kurahashi, Kashiba (JP); Hiroshi Nakatsu, Tenri (JP); Hiroyuki Hosoba, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 256 days.

(21) Appl. No.: 09/761,829

(22) Filed: Jan. 18, 2001

(65) Prior Publication Data

US 2001/0050530 A1 Dec. 13, 2001

(30) Foreign Application Priority Data

Jan. 18, 2000 (JP) ........................ 2000-008932
Nov. 6, 2000 (JP) ........................ 2000-337371

(51) Int. Cl.[7] .............................................. H01L 33/00
(52) U.S. Cl. ........................................ 257/97; 257/103
(58) Field of Search ....................... 257/94, 95, 96, 257/97, 103, 444

(56) References Cited

U.S. PATENT DOCUMENTS

| 5,105,236 A | * | 4/1992 | Hayakawa | 257/88 |
| 5,732,098 A | * | 3/1998 | Nisitani et al. | 372/45 |
| 5,808,324 A | * | 9/1998 | Yamada et al. | 257/96 |
| 6,246,078 B1 | * | 6/2001 | Sasaki et al. | 257/96 |
| 6,265,732 B1 | * | 7/2001 | Nakatsu et al. | 257/86 |

FOREIGN PATENT DOCUMENTS

| EP | 0 886 326 A2 | 12/1998 | |
| JP | 59-20888 A2 | 11/1984 | |
| JP | 2-151085 | 6/1990 | |
| JP | 2174273 | 7/1990 | |
| JP | 7-288338 | 10/1995 | |
| JP | 8-18102 | 1/1996 | |
| JP | 10-284756 A2 | 10/1998 | |
| JP | 2000228536 A | * 8/2000 | ........... H01L/33/00 |

OTHER PUBLICATIONS

Wang, Li et al. (1996). "Time–Resolved Carrier Recombination Dynamics of 1.3–1.8 nm Broadband Light Emitting Diode Structures," *J. Appl. Phys.* 80(12):6965–6971.

* cited by examiner

Primary Examiner—Carl Whitehead, Jr.
Assistant Examiner—William C. Vesperman
(74) Attorney, Agent, or Firm—Morrison & Foerster LLP

(57) ABSTRACT

A light emitting diode (LED) of a double hetero-junction type has a light-emitting layer of a GaAlInP material, a p-type cladding layer and an n-type cladding layer sandwiching the light-emitting layer therebetween, a p-side electrode formed on the p-type cladding layer side, and an n-side electrode formed on the n-type cladding layer side. The p-type cladding layer consists of a first p-type cladding layer positioned closer to the light-emitting layer and having a lower aluminum content and a lower impurity concentration, and a second p-type cladding layer positioned less closer to the light-emitting layer and having a higher aluminum content and a higher impurity concentration. The LED also has a current blocking layer below the p-side electrode for locally blocking electric current flowing from the p-side electrode to the n-side electrode.

5 Claims, 13 Drawing Sheets

THICKNESS OF FIRST P-TYPE CLADDING LAYER (μm)

LIGHT EMITTING DIODE

BACKGROUND OF THE INVENTION

The present invention relates to a light emitting diode (LED) having a double hetero-structure and more particularly to an LED that has a high optical power and can be used at a large current.

A highly efficient LED having a double hetero-structure as shown in FIG. 21 is known. FIG. 21 is a vertical sectional view showing an AlGaInP LED in which layers are lattice-matched with a GaAs substrate 1. The structure of each layer in the LED is as follows:

Substrate 1:
   made of an n-type GaAs
Buffer layer 2:
   made of n-type GaAs
N-type cladding layer 3
   made of n-type $(Ga_{0.3}Al_{0.7})_{0.5}In_{0.5}P$
   impurity: Si, impurity concentration: $1 \times 10^{18}$ cm$^{-3}$, and thickness: 1 μm
Light-emitting layer 4:
   made of p-type $(Ga_{0.7}Al_{0.3})_{0.5}In_{0.5}P$
   thickness: 0.5 μm
P-type cladding layer 5:
   made of p-type $Al_{0.5}In_{0.5}P$
   impurity: Zn, impurity concentration: $5 \times 10^{17}$ cm$^{-3}$, and thickness: 1 μm
First current diffusion layer 7:
   made of p-type $Ga_{0.3}Al_{0.7}As$
   impurity: Zn, impurity concentration: $1 \times 10^{18}$ cm$^{-3}$, and thickness: 1 μm
Second current diffusion layer 8:
   made of p-type $Ga_{0.3}Al_{0.7}As$
   impurity: Zn, impurity concentration: $3 \times 10^{18}$ cm$^{-3}$, and thickness: 6 μm
Contact layer 9:
   made of p-type GaAs An n-side electrode 10 is formed on the underside of the n-type GaAs substrate 1. A p-side electrode 11 is formed on the p-type GaAs contact layer 9.

The n-type GaAs buffer layer 2 is intended to eliminate defects of the n-type GaAs substrate 1 and influence of contaminants in the substrate and is not required if the n-type GaAs substrate 1 is surface-treated favorably. The p-type GaAs contact layer 9 has a GaAs structure not containing Al to facilitate an ohmic contact between the p-type GaAs contact layer 9 and the p-side electrode 11. The GaAs composing the contact layer 9 does not transmit light generated from the p-type $(Ga_{0.7}Al_{0.3})_{0.5}In_{0.5}P$ light-emitting layer 4, but no problem is raised because the contact layer is formed immediately below the p-side electrode 11.

Sharp K. K. has recently proposed an LED, a vertical sectional view of which is shown in FIG. 22, to achieve higher reliability than the above LED (Japanese Patent Application No. 10-338656). The structure of each layer in the LED is as follows:

Substrate 21:
   made of n-type GaAs
Buffer layer 22:
   made of n-type GaAs
N-type cladding layer 23:
   made of n-type $(Ga_{0.3}Al_{0.7})_{0.5}In_{0.5}P$
   impurity: Si, impurity concentration: $1 \times 10^{18}$ cm$^{-3}$, and thickness: 1 μm
Light-emitting layer 24:
   made of p-type $(Ga_{0.7}Al_{0.3})_{0.5}In_{0.5}P$
   thickness: 0.5 μm
First p-type cladding layer 26:
   p-type $(Ga_{0.5}Al_{0.5})_{0.5}In_{0.5}P$
   impurity: Zn, impurity concentration: $1 \times 10^{17}$ cm$^{-3}$, and thickness: 0.2 μm
Second p-type cladding layer 27:
   made of p-type $Al_{0.5}In_{0.5}P$
   impurity: Zn, impurity concentration: $5 \times 10^{17}$ cm$^{-3}$, and thickness: 1.0 μm
Current diffusion layer 28:
   made of p-type $Ga_{0.9}In_{0.1}P$
   impurity: Zn, impurity concentration: $1 \times 10^{18}$ cm$^{-3}$, and thickness: 7 μm
Contact layer 29:
   made of p-type GaIs An n-side electrode 30 is formed on the underside of the n-type GaAs substrate 21. A p-side electrode 31 is formed on the p-type GaAs contact layer 29.

A p-type cladding layer 25 is formed as a two-layer structure consisting of the p-type $(Ga_{0.5}Al_{0.5})_{0.5}In_{0.5}P$ first cladding layer 26 and the p-type $Al_{0.5}In_{0.5}P$ second cladding layer 27. Accordingly, it is possible to prevent a p-type impurity from diffusing to the p-type $(Ga_{0.7}Al_{0.3})_{0.5}In_{0.5}P$ light-emitting layer 24 although the p-type impurity has a large impurity gradient and is liable to diffuse when electric current flows through the LED for a long time. Thus it is possible to prevent deterioration of the optical power of the LED.

The LED is used in the form of a chip. Conventionally, an LED wafer is divided into chips of a size of 200 μm–300 μm by 200 μm–300 μm. In the above LEDs, the p-type GaAs contact layers 9, 29 and the p-side electrodes 11, 31 are formed circular and disposed at the center of each chip. FIG. 23 shows a planar configuration of the chip.

The above LEDs have the following problem: Electric current flows immediately below the p-side electrodes 11, 31. Both the p-side electrodes 11, 31 and the p-type Gabs contact layers 9, 29 disposed under the p-side electrodes 11, 31 are opaque. Thus, the p-side electrodes 11, 31 and the contact layers 9, 29 intercept light coming from parts of the p-type $(Ga_{0.7}Al_{0.3})_{0.5}In_{0.5}P$ light-emitting layers coming from parts of the p-type $(Ga_{0.7}Al_{0.3})_{0.5}In_{0.5}P$ light-emitting layers 4, 24 that are located immediately below the p-side electrodes 11, 31. Thus, the light coming from those parts cannot be taken out to the outside. Accordingly, the above LEDs have a low light-emitting efficiency.

The LED chips are conventionally used at electric current having an intensity of several milliamperes to 50 mA. If the LED chip is used for an electric current having intensity higher than that, the optical power of the LED chip will saturate and characteristics will deteriorate with the passage of a current.

SUMMARY OF THE INVENTION

Therefore, it is an object of the present invention to provide an LED in which light emission immediately below an electrode is restricted to improve light take-out efficiency so that the LED has an improved light-emitting characteristic when it is used at a large current of several milliamperes to 50 mA or more.

In order to accomplish the above object, there is provided, according to an aspect of the invention, a light emitting diode of a double hetero-junction type comprising:

a light-emitting layer composed of a GaAlInP material;

a p-type cladding layer and an n-type cladding layer sandwiching the light-emitting layer therebetween;

a p-side electrode formed on the p-type cladding layer side; and an n-side electrode formed on the n-type cladding layer side;

the p-type cladding layer consisting of a first p-type cladding layer positioned closer to the light-emitting layer and having a lower aluminum content and a lower impurity concentration, and a second p-type cladding layer positioned farther from the light-emitting layer and having a higher aluminum content and a higher impurity concentration; and a current blocking layer for locally blocking electric current flowing from the p-side electrode to the n-side electrode.

The current blocking layer may be provided immediately below the p-side electrode which is opaque. With this arrangement, electric current flowing to those parts of the light-emitting layer that are positioned immediately below the p-side electrode is restricted. By thus suppressing emission of unrequired light which would be intercepted by the opaque p-side electrode, it is possible to enhance the light take-out efficiency and thus improve the optical power. That is, the external light emission efficiency can be enhanced.

If the thickness of the first p-type cladding layer is within a range of 0.2 $\mu$m to 0.5 $\mu$m inclusive, an initial luminous intensity ratio of 100% can be obtained. Thus, it is possible to increase reliability of the LED.

In one embodiment, the p-side electrode has an electrode window consisting of an opening, and the current blocking layer has an opening at a position confronting the electrode window of the p-side electrode, and the opening of the current blocking layer serves as a current path for intensively passing electric current from the p-side electrode through the light emitting diode.

According to the structure, the current density is increased and thus the internal light-emitting efficiency is also increased. There is a fear that the increase of the current density will reduce the optical power if electric current is passed through the LED for a long time. But such reduction of the optical power can be suppressed because the p-type cladding layer consists of the first and second layers.

An appropriate current density can be obtained by setting the area of the current path to the range of 1,000 $\mu$m$^2$ to 40,000 $\mu$m$^2$. Consequently, the internal light-emitting efficiency can be enhanced. In the case where the area of the current path is set to the range of 1,000 $\mu$m$^2$ to 20,000 m$^2$, a comparatively dark portion is prevented from taking place in the center of the current path even when the diameter of the current path is 150 $\mu$m or more. In the case where the area of the current path is set to the range of 1,000 $\mu$m$^2$ to 10,000 $\mu$m$^2$, a high optical power can be obtained even when the LED is driven at 20 mA.

In one embodiment, the p-side electrode is formed at a central portion of a surface, and the current blocking layer is formed at a position confronting the p-side electrode such that electric current coming from the p-side electrode flows around of the current blocking layer.

The p-side electrode may be formed at a central part of a surface of a layer. In this case, the LED, which has a high optical power, is fabricated by using the same electrode-forming process as that conventionally used.

The current blocking layer may be formed inside a current diffusion layer. In this case, the current blocking layer is located in a position nearer to the light-emitting layer than when the current blocking layer is formed on the upper surface of the current diffusion layer. Accordingly, it is possible to prevent electric current whose path has been restricted by the current blocking layer from being unfavorably diffused before it reaches the light-emitting layer.

There is also provided, according to a second aspect of the present invention, a light emitting diode of a double heterojunction type in which a light-emitting layer made of a GaAlInP material is interposed between a p-type cladding layer and an n-type cladding layer, wherein:

a p-side electrode is formed on a p-type cladding layer-side surface having an area of 0.15 mm$^2$ or more; and any point present in a region not containing the p-side electrode of the p-type cladding layer-side surface is within a distance of (Ld×2) from some point on an edge of the p-side electrode, where Ld is a distance from a position at which an optical power is maximum, to a position at which the optical power attenuates by 90%.

According to the construction, it is possible to obtain a favorable current diffusion and thus, suppress the increase of the current density. Therefore, even if the LED is used at a large electric current, the current density will not become too high. Accordingly, it is possible to prevent saturation of the optical power of the LED and deterioration in application of electric current to the LED. Thus, it is possible to improve the light-emitting characteristic at a large current.

When the distribution of the optical output of an LED chip is examined along a line A–A', as shown in FIG. 17A, passing through a p-side electrode 161, the distance Ld is a distance from a position close to the p-side electrode 161 at which the optical power is maximum, to a position at which the optical power attenuates by 90% as compared with the maximum value, as shown in FIG. 17B. Then, according to the present invention, as shown in an explanatory illustration of FIG. 18, the p-side electrode (denoted by 162 in FIG. 18) is provided such that any point present in a region not containing the p-side electrode of the p-type cladding layer-side surface is within the distance of (Ld×2) from the edge of the p-side electrode.

The p-side electrode may comprise a plurality of branch electrodes and a connection electrode connecting the branch electrodes to each other electrically.

In one embodiment, an interval between the branch electrodes is approximately Ld.

The surface on which the p-side electrode is formed may have two opposed parallel straight sides, and the branch electrodes may be each strip-shaped, and arranged parallel with the two sides and with each other.

In one embodiment, an interval between an outermost branch electrode and the side of the surface opposed to this branch electrode is approximately Ld/2.

Furthermore, according to a third aspect of the invention, there is provided a light emitting diode of a double heterojunction type in which a light-emitting layer made of a GaAlInP material is interposed between a p-type cladding layer and an n-type cladding layer, comprising:

a current blocking layer formed on a p-type cladding layer-side surface having an area of 0.15 mm$^2$ or more; and a p-side electrode formed at a position above the current blocking layer and opposed to the current blocking layer, wherein any point present in a region not containing the current blocking layer of the p-type cladding layer-side surface is within a distance of (Ld×2) from some point on an edge of the current blocking layer, where Ld is a distance from a position at which an optical power is maximum, to a position at which the optical power attenuates by 90%.

According to the construction, it is possible to obtain a favorable current diffusion and thus, suppress the increase of the current density. Therefore, even if the LED is used at a large electric current, the current density will not become too high. Accordingly, it is possible to prevent saturation of the optical power of the LED and deterioration in application of electric current to the LED. Thus, it is possible to improve the light-emitting characteristic at a large current.

Regarding the distance Ld, when the distribution of the optical output of an LED chip is examined along a line B—B' passing through a p-side electrode 163, as shown in FIG. 19A, the distance Ld is a distance from a position close to a current blocking layer 164 at which an optical power is maximum, to a position at which the optical power attenuates by 90% as compared with the maximum optical power, as shown in FIG. 19B. Then, according to the present invention, as shown in an explanatory illustration of FIG. 20, the current blocking layer (denoted by 165 in FIG. 20) is provided such that any point present in a region not containing the current blocking layer of the p-type cladding layer-side surface is within the distance of (Ld×2) from the edge of the current blocking layer.

In one embodiment, the current blocking layer comprises a plurality of blocking branch portions and a connection portion connecting the blocking branch portions to each other electrically, and an interval between adjacent blocking branch portions is approximately Ld.

The surface on which the current blocking layer may formed has two opposed parallel straight sides, and the blocking branch portions may be each strip-shaped and arranged parallel with the two sides and with each other.

In one embodiment, an interval between an outermost blocking branch portion and the side of the surface opposed to this outermost blocking branch portion is approximately Ld/2.

There is also provided, according to a fourth aspect of the present invention, a light emitting diode of a double heterojunction type in which a light-emitting layer made of a GaAlInP material is interposed between a p-type cladding layer and an n-type cladding layer, wherein:

a p-side electrode is formed on a p-type cladding layer-side surface, the p-side electrode consisting of a plurality of mutually connected constituent parts; and any point present in a region not containing the p-side electrode of the p-type cladding layer-side surface is within a distance of (Ld×2) from some point on an edge of the p-side electrode, where Ld is a distance from a position at which an optical power is maximum, to a position at which the optical power attenuates by 90%.

In the LED according to any one of the second through the fourth aspects, if a current diffusion layer made of an AlGaInP material is provided between the p-type cladding layer and the p-side electrode, electric current favorably diffused by the p-side electrode or the current blocking layer is further diffused positively by the current diffusion layer. In this manner, it is possible to obtain more favorable current diffusion.

Also, if a barrier layer having a band gap intermediate between band gaps of the light-emitting layer and the p-type cladding layer is provided between the light-emitting layer and the p-type cladding layer, it is possible to prevent a p-type impurity from diffusing to the light-emitting layer, although the p-type impurity has a large impurity gradient and is liable to diffuse when electric current is passed through the LED for a long time. Thus it is possible to prevent deterioration of the optical output of the LED and improve the reliability thereof.

Furthermore, if a barrier layer having a band gap intermediate between band gaps of the light-emitting layer and the n-type cladding layer is provided between the light-emitting layer and the n-type cladding layer, it is possible to prevent an n-type impurity from diffusing to the light-emitting layer. Thus it is possible to prevent deterioration of the optical output power of the LED and improve the reliability thereof.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

First Embodiment

Figure 1:
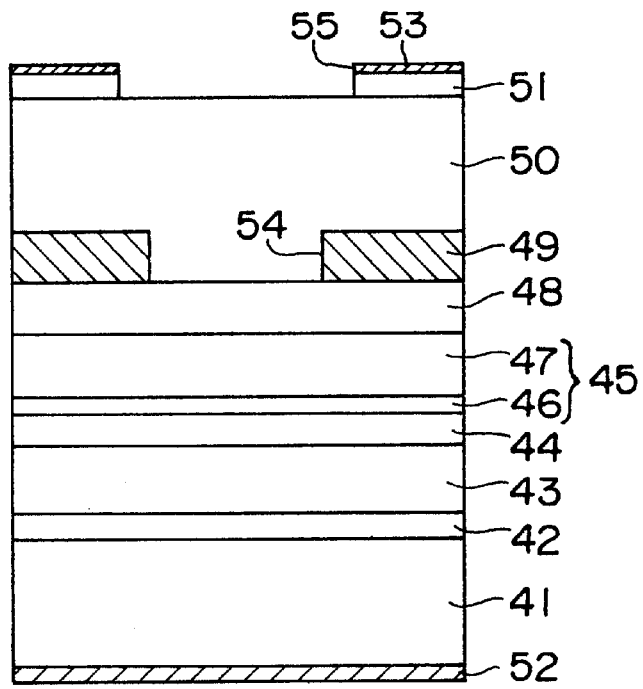
FIG. 1 is a vertical sectional view showing the layer structure of an LED of a first embodiment of the present invention.

FIG. 1 a vertical sectional view showing the layer structure of the LED of a first embodiment of the present invention. The LED shown in FIG. 1 is an AlGaInP LED in which layers are lattice-matched with a GaAs substrate 41. The structure of each layer is as follows:

Substrate 41:
  made of n-type GaAs
Buffer layer 42:
  made of n-type GaAs
N-type cladding layer 43:
  made of n-type $(Ga_{0.3}Al_{0.7})_{0.5}In_{0.5}P$
    impurity: Si, impurity concentration: $1\times10^{18}$ cm$^{-3}$, and thickness: 1 μm
Light-emitting layer 44:
  made of p-type $(Ga_{0.7}Al_{0.3})_{0.5}In_{0.5}P$
    thickness: 0.5 μm
First p-type cladding layer 46:
  made of p-type $(Ga_{0.5}Al_{0.5})_{0.5}In_{0.5}P$
    impurity: Zn, impurity concentration: $1\times10^{17}$ cm$^{-3}$, and thickness: 0.2 μm
Second p-type cladding layer 47:
  made of p-type $Al_{0.5}In_{0.5}P$
    impurity: Zn, impurity concentration: $5\times10^{17}$ cm$^{-3}$, and thickness: 1.0 μm
First p-type current diffusion layer 48:
  made of a p-type $Ga_{0.9}In_{0.1}P$
    impurity: Zn, impurity concentration: $1\times10^{18}$ cm$^{-3}$, and thickness: 1 μm
N-type current blocking layer 49:
  made of n-type $Ga_{0.9}In_{0.1}P$
    impurity: Si, impurity concentration: $1\times10^{18}$ cm$^{-3}$, and thickness: 0.5 μm
Second p-type current diffusion layer 50:
  made of p-type $Ga_{0.9}In_{0.1}P$
    impurity: Zn, impurity concentration: $1\times10^{18}$ cm$^{-3}$, and thickness: 7 μm
Contact layer 51:
  made of a p-type GaAs An n-side electrode 52 is formed on the underside of the n-type GaAs substrate 41. A p-side electrode 53 is formed on the p-type GaAs contact layer 51.

In the LED having the structure is fabricated in the following manner. After the n-type GaAs buffer layer 42 through the n-type $Ga_{0.9}In_{0.1}P$ current blocking layer 49 are sequentially formed on the n-type GaAs substrate 41, the n-type $Ga_{0.9}In_{0.1}P$ current blocking layer 49 is partly removed to form a current blocking structure. Then, the p-type $Ga_{0.9}In_{0.1}P$ second current diffusion layer 50 is laminated on the n-type $Ga_{0.9}In_{0.1}P$ current blocking layer 49.

In the first embodiment, MOCVD (metal organic chemical vapor deposition) method is used for the film formation. But in the present invention, the film growth method is not limited to the MOCVD. For example, MBE (molecular beam epitaxy) method or MCBE (metal organic molecular beam epitaxy) method may be used.

Figure 2:
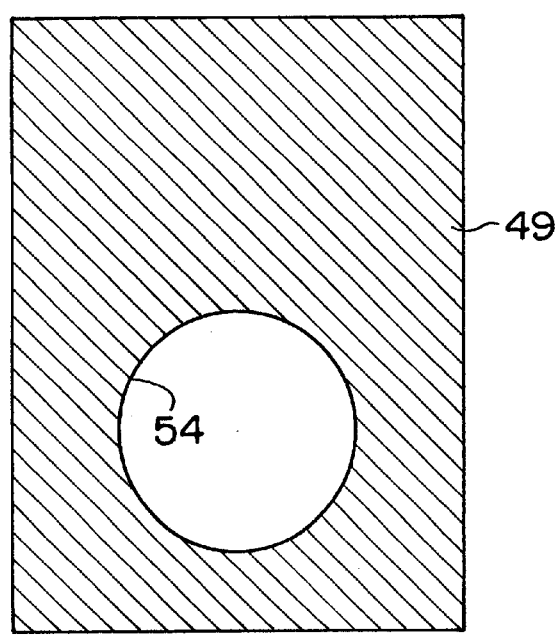
FIG. 2 is a plan view showing the LED shown in FIG. 1 in which layers are formed up to a current blocking structure.

FIG. 2 shows the LED, as viewed from above, in which the layers have been formed up to the current blocking structure. To collectively pass electric current through an internal portion of the LED, the current blocking structure of the first embodiment is constructed by providing the n-type $Ga_{0.9}In_{0.1}P$ current blocking layer 49 so as to define a circular hole (current path) 54 therein. As in the case of the current blocking layer 49, the p-side electrode 53 is also constructed so as to define a circular hole (electrode window) 55 therein to take out light emitted from the light-emitting layer 44 from the current path 54 inside the current blocking layer 49 and the electrode window 55 inside the p-side electrode 53. In this case, the current density can be changed by varying the size of the current path 54 to thereby improve the light-emitting efficiency.

Figure 3:
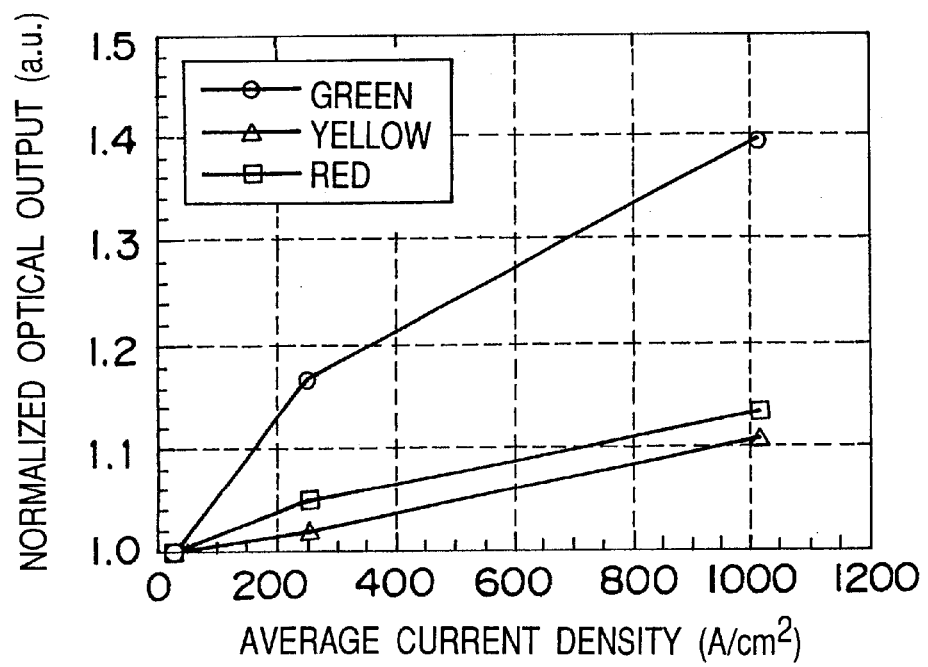
FIG. 3 shows dependency of an optical output of the LED shown in FIG. 1 on a current density.

FIG. 3 shows dependency of the optical power of the LED on a current density for different wavelengths of emitted light (namely, for colors of emitted light). FIG. 3 indicates that the optical power is improved by increasing the current density. In particular, because the optical power of a short wavelength (green) depends on the current density, it is effective to use the current blocking structure formed of the current blocking layer 49.

As described above, in the first embodiment, the following layers are sequentially formed on the n-type GaAs substrate 41: the n-type GaAs buffer layer 42, the n-type GaAlInP cladding layer 43, the p-type GaAlInP light-emitting layer 44, the p-type GaAlInP first cladding layer 46, the p-type GaAlInP second cladding layer 47, the p-type GaAlInP first current diffusion layer 48, and the n-type GaInP current blocking layer 49. Then, to form the current blocking structure, an internal portion of the current blocking layer 49 is removed circularly to form the current path 54. Thereafter, the p-type GaInP second current diffusion layer 50, the p-type GaAs contact layer 51, and the p-side electrode 53 are sequentially formed on the current blocking layer 49. Then, the electrode window 55 is formed by circularly removing a part disposed immediately above the current path 54 from the contact layer 51 and the p-side electrode 53.

Accordingly, electric current discharged from the p-side electrode 53 formed in the periphery of the upper surface of the LED passes through the current path 54 inside the current blocking layer 49 and is collectively supplied into the light-emitting layer 44. By constructing the LED such that electric current is prevented from flowing immediately below the opaque p-side electrode 53, the light take-out efficiency can be improved. That is, according to the first embodiment, an LED having a high optical power can be provided.

Figure 4:
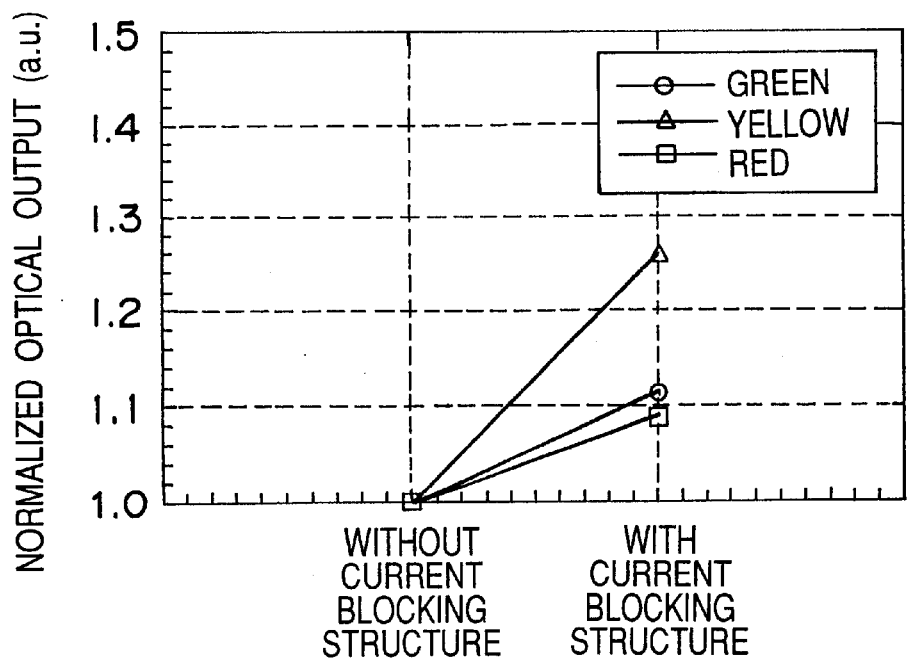
FIG. 4 shows the optical output of an LED having a current blocking structure in comparison with that of an LED having no current blocking structure.

FIG. 4 shows the optical power of the LED having the current blocking structure formed of the current blocking layer 49 in comparison with that of the conventional LED not having the current blocking structure for different wavelengths of emitted light (for colors of emitted light). FIG. 4 indicates that by providing the LED with the current blocking structure as carried out in the first embodiment, the optical power of the LED having the current blocking structure is improved 1.1–1.3 times as large as that of the conventional LED not having the current blocking structure.

Second Embodiment

Figure 5:
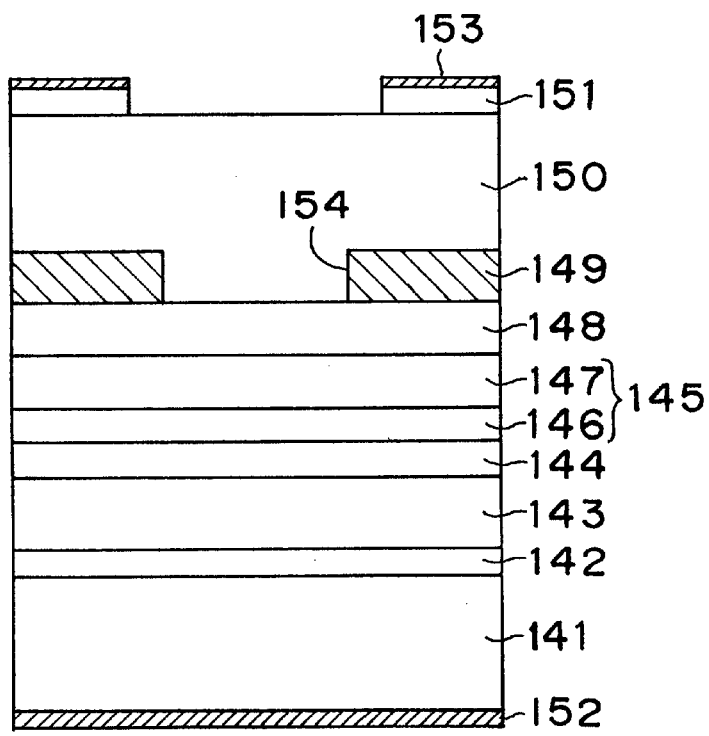
FIG. 5 is a vertical sectional view showing an LED of a second embodiment of the present invention.

In the second embodiment, the thickness of the first p-type cladding layer is larger than that of the first p-type cladding layer of the first embodiment to allow the LED of the second embodiment to have higher reliability than that of the first embodiment. FIG. 5 is a vertical section view showing the layered structure of the LED of the second embodiment. The structure of each layer is as follows:

Substrate 141:
  made of n-type GaAs
Buffer layer 142:
  made of n-type GaAs
N-type cladding layer 143:
  made of n-type $(Ga_{0.3}Al_{0.7})_{0.5}In_{0.5}P$
    impurity: Si, impurity concentration: $1\times10^{18}$ cm$^{-3}$, and thickness: 1 µm
Light-emitting layer 144:
  made of p-type $(Ga_{0.7}Al_{0.3})_{0.5}In_{0.5}P$
    thickness: 0.5 µm
First p-type cladding layer 146:
  made of a p-type $(Ga_{0.5}Al_{0.5})_{0.5}In_{0.5}P$
    impurity: Zn, impurity concentration: $1\times10^{17}$ cm$^{-3}$, and thickness: 0.4 µm
Second p-type cladding layer 147:
  made of p-type $Al_{0.5}In_{0.5}P$
    impurity: Zn, impurity concentration: $5\times10^{17}$ cm$^{-3}$, and thickness: 1.0 µm
First p-type current diffusion layer 148:
  made of p-type GaP
    thickness: 1.0 µm
N-type current blocking layer 149:
  made of n-type GaP
    thickness: 0.5 µm
Second p-type current diffusion layer 150:
  made of p-type $Al_{0.01}Ga_{0.98}In_{0.01}P$
    thickness: 7 µm
Contact layer 151:
  made of p-type GaAs An n-side electrode 152 is formed on the underside of the n-type GaAs substrate 141. A p-side electrode 153 is formed on the p-type GaAs contact layer 151.

Figure 6:
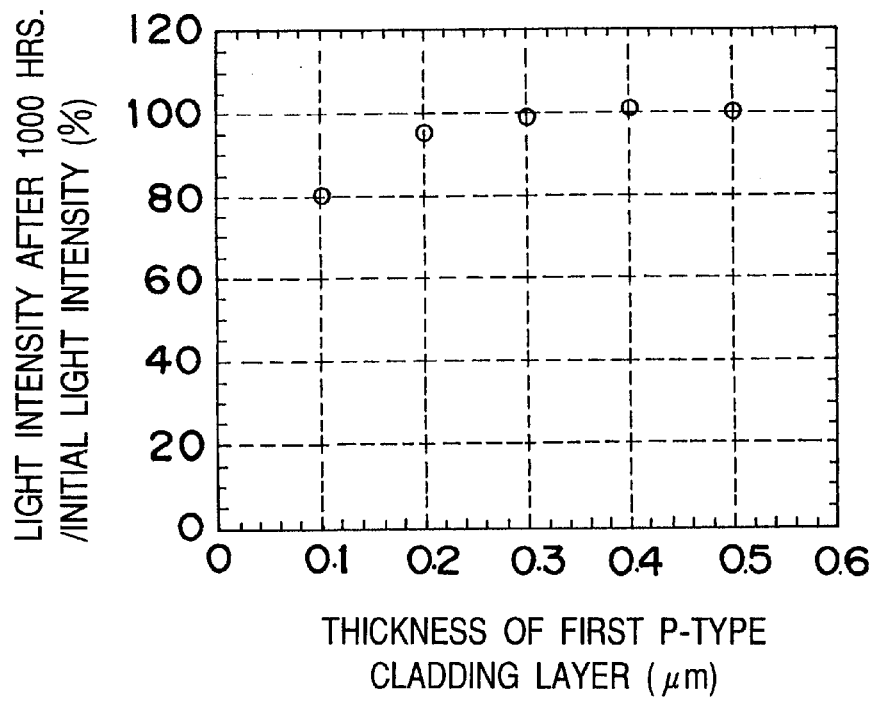
FIG. 6 shows the relationship between the thickness of a first p-type cladding layer of the LED shown in FIG. 5 and deterioration of the LED.

The film thickness of the first p-type cladding layer 146 of the LED having the structure is 0.4 µm, while the film thickness of the first p-type cladding layer 46 of the first embodiment is 0.2 µm. By making the first p-type cladding layer 146 thicker than the first p-type cladding layer 46, it is possible to improve the reliability of the LED and use the LED at a higher current density. FIG. 6 shows the relationship between the film thickness of the first p-type cladding layer 146 of the LED and the deterioration of the optical characteristics of the LED when the diameter of the circular current path 154 is 70 µm and when electric current is passed through the LED for 1,000 hours at 50 mA. As obvious from FIG. 6, it is preferable that the thickness of the first p-type cladding layer 146 is in the range of 0.2 µm to 0.5 µm. Further, an etching operation for forming the current path can be easily controlled by composing the first p-type current diffusion layer 148 and the n-type current blocking layer 149 of the GaP.

Third Embodiment

In the first embodiment, the current path 54 is formed inside of the current blocking layer 49. But the present invention is not limited to the mode of the first embodiment.

Figure 7:
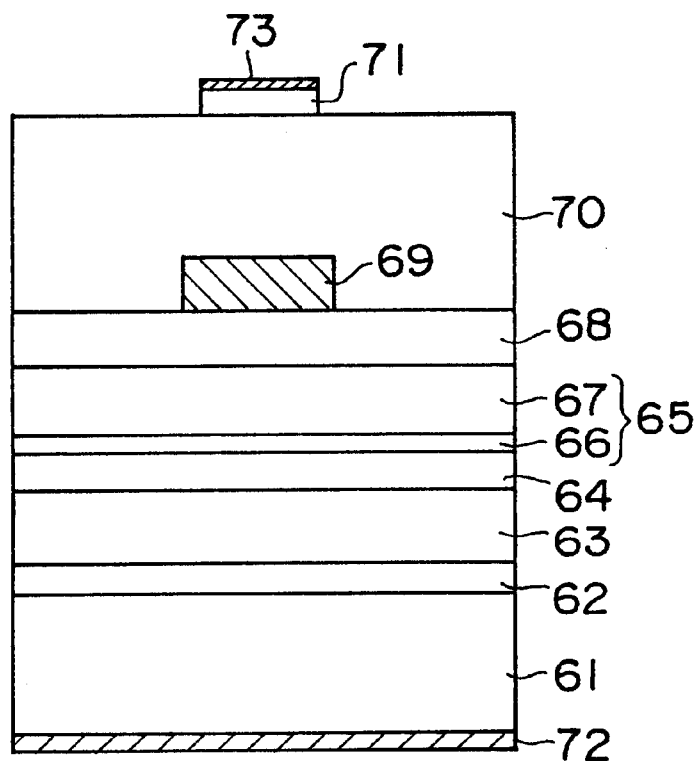
FIG. 7 is a vertical sectional view showing an LED of a third embodiment of the present invention.

FIG. 7 is a vertical sectional view showing an AlGaInP LED having a current path around a current blocking layer 69. In the LED, as in the case of the LED shown in FIG. 1, the following layers are sequentially formed on an n-type GaAs substrate 61: an n-type GaAs buffer layer 62, an n-type $(Ga_{0.3}Al_{0.7})_{0.5}In_{0.5}P$ cladding layer 63, a p-type $(Ga_{0.7}Al_{0.3})_{0.5}In_{0.5}P$ light-emitting layer 64, a p-type $(Ga_{0.5}Al_{0.5})_{0.5}In_{0.5}P$ first cladding layer 66, a p-type $Al_{0.5}In_{0.5}P$ second cladding layer 67, a p-type $Ga_{0.9}In_{0.1}P$ first current diffusion layer 68, and an n-type $Ga_{0.9}In_{0.1}P$ current blocking layer 69.

The periphery of the current blocking layer 69 is removed with its central part left circularly to form a current blocking structure. Then, a p-type $Ga_{0.9}In_{0.1}P$ second current diffusion layer 70 is formed to cover the current blocking layer 69. A circular p-type GaAs contact layer 71 and a circular p-side electrode 73 are formed on the second current diffusion layer 70 at a part thereof immediately above the circular current blocking layer 69. An n-side electrode 72 is formed on the underside of the n-type GaAs substrate 61.

Figure 8:
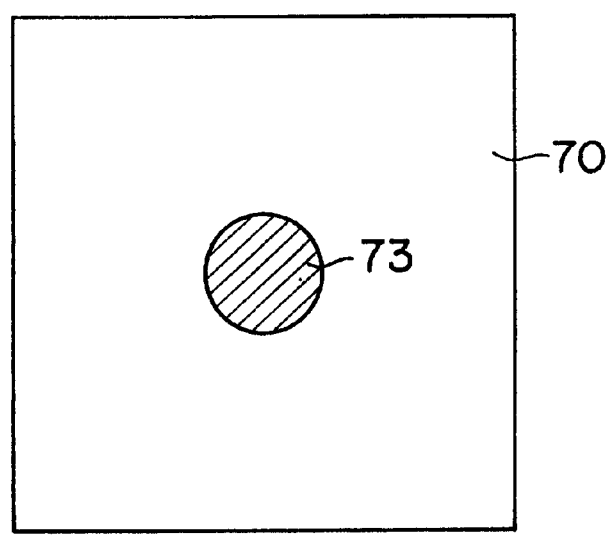
FIG. 8 is a plan view showing the LED shown in FIG. 7.

In this case, as shown in FIG. 8 which is a view as seen from above, the p-type GaAs contact layer 71 and the p-side electrode 73 are formed in a circular shape at the center of the second current diffusion layer 70, as in the case of the conventional LED. Accordingly, the third embodiment has an advantage that the conventional process of manufacturing the p-type contact layer and the p-side electrode is applicable to the formation of the circular p-type GaAs contact layer 71 and the circular p-side electrode 73.

The present invention is not limited to the mode of the first through third embodiments, but can be embodied by changing the configuration of the current blocking layer (current blocking structure) and that of the p-side electrode.

Fourth Embodiment

Figure 9:
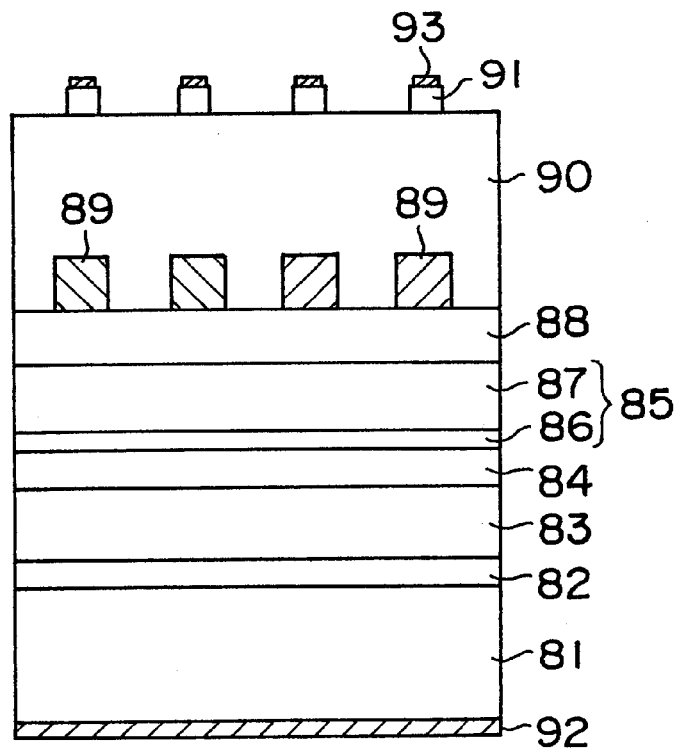
FIG. 9 is a vertical sectional view showing an LED of a fourth embodiment of the present invention.

FIG. 9 is a vertical sectional view showing an AlGaInP LED having its emission characteristic at a large current improved by diffusing electric current favorably and suppressing increase of a current density. The structure of each layer is as follows:

Substrate 81:
  made of n-type GaAs
Buffer layer 82:
  made of n-type GaAs
N-type cladding layer 83:
  made of n-type $(Ga_{0.3}Al_{0.7})_{0.5}In_{0.5}P$
    impurity: Si, impurity concentration: $1\times10^{18}$ cm$^{-3}$, and thickness: 1 µm
Light-emitting layer 84:
  made of p-type $(Ga_{0.7}Al_{0.3})_{0.5}In_{0.5}P$
    thickness: 0.5 µm
First p-type cladding layer 86:
  made of p-type $(Ga_{0.5}Al_{0.5})_{0.5}In_{0.5}P$
    impurity: Zn, impurity concentration: $1\times10^{17}$ cm$^{-3}$, and thickness: 0.2 µm
Second p-type cladding layer 87:
  made of p-type $Al_{0.5}In_{0.5}P$
    impurity: Zn, impurity concentration: $5\times10^{17}$ cm$^{-3}$, and thickness: 1.0 µm
First p-type current diffusion layer 88:

made of p-type $Al_{0.01}Ga_{0.98}In_{0.01}P$
  impurity: Zn, impurity concentration: $1 \times 10^{18}$ cm$^{-3}$, and thickness: 1 μm
N-type current blocking layer 89:
  made of n-type $Al_{0.01}Ga_{0.98}In_{0.01}P$
  impurity: Si, impurity concentration: $1 \times 10^{18}$ cm$^{-3}$, and thickness: 0.5 μm
Second p-type current diffusion layer 90:
  made of p-type $Al_{0.01}Ga_{0.98}In_{0.01}P$
  impurity: Zn, impurity concentration: $1 \times 10^{18}$ cm$^{-3}$, and thickness: 7 μm
Contact layer 91:
  made of p-type GaAs An n-side electrode 92 is formed on the underside of the n-type GaAs substrate 81. A p-side electrode 93 is formed on the p-type GaAs contact layer 91.

In the fourth embodiment, a p-type cladding layer 85 is formed as a two-layer structure consisting of the first p-type cladding layer 86 and the second p-type cladding layer 87. Accordingly, it is possible to prevent a p-type impurity from diffusing to the light-emitting layer 84 although the p-type impurity has a large impurity gradient and is liable to diffuse when electric current is passed through the LED for a long time. Thus it is possible to prevent deterioration of the optical power. That is, in the fourth embodiment, the first p-type cladding layer 86 constitutes a barrier layer.

The LED having the structure is formed in the following manner. The n-type GaAs buffer layer 82 through the n-type $Al_{0.01}Ga_{0.98}In_{0.01}P$ current blocking layer 89 are sequentially formed on the n-type GaAs substrate 81, and then, the n-type $Al_{0.01}Ga_{0.98}In_{0.01}P$ current blocking layer 89 is partly removed to form the current blocking structure. Then, the p-type $Al_{0.01}Ga_{0.98}In_{0.01}P$ second current diffusion layer 90 is formed on the n-type $Al_{0.01}Ga_{0.98}In_{0.01}P$ current blocking layer 89. The p-side electrode 93 is formed immediately above the current blocking layer 89 such that the p-side electrode 93 has the almost same planar configuration as that of the current blocking layer 89. The light take-out efficiency is improved by thus blocking supply of electric current to the light-emitting layer 84 disposed immediately below the p-side electrode 93 which does not transmit light.

Figure 10A:
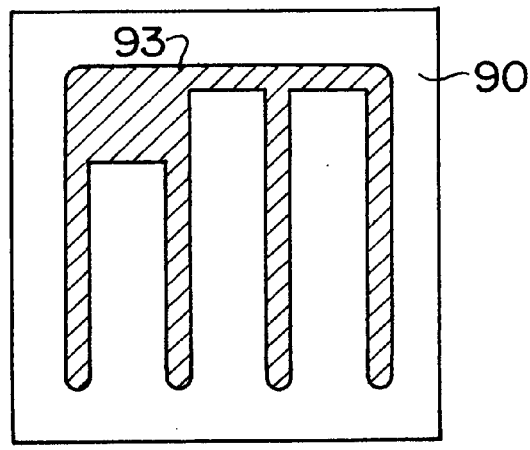
FIGS. 10A and 10B are plan views showing the LED shown in FIG. 9 in which layers are formed up to a current blocking structure and layers are formed up to a p-side electrode, respectively.
Figure 10B:
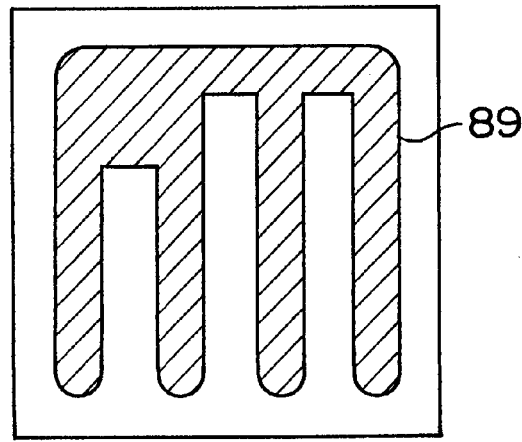

FIGS. 10A and 10B shows the LED, as viewed from above, in a state in which the n-type GaAs buffer layer 82 through the current blocking structure have been formed and in a state in which the n-type GaAs buffer layer 82 through the p-side electrode 93 have been formed, respectively. FIG. 10A shows a planar configuration of the p-side electrode 93. FIG. 10B shows a planar configuration of the current blocking layer 89. As shown in FIG. 10B, the current blocking layer 89 has a planar configuration in which short strips (blocking branch portions) each having a width of 60 μm are arranged at regular intervals of 80 μm and are connected at one end thereof to a short strip (a connection portion) having the width of 60 μm. As shown in FIG. 10A, the p-side electrode 93 has a planar configuration in which short strips each having a width of 30 μm are arranged at regular intervals of 110 μm and connected at one end thereof to a short strip having the width of 30 μm. An LED wafer thus grown/formed is used by dividing it into chips of 560 μm×560 μm (area: 0.3136 mm$^2$).

Figure 11A:
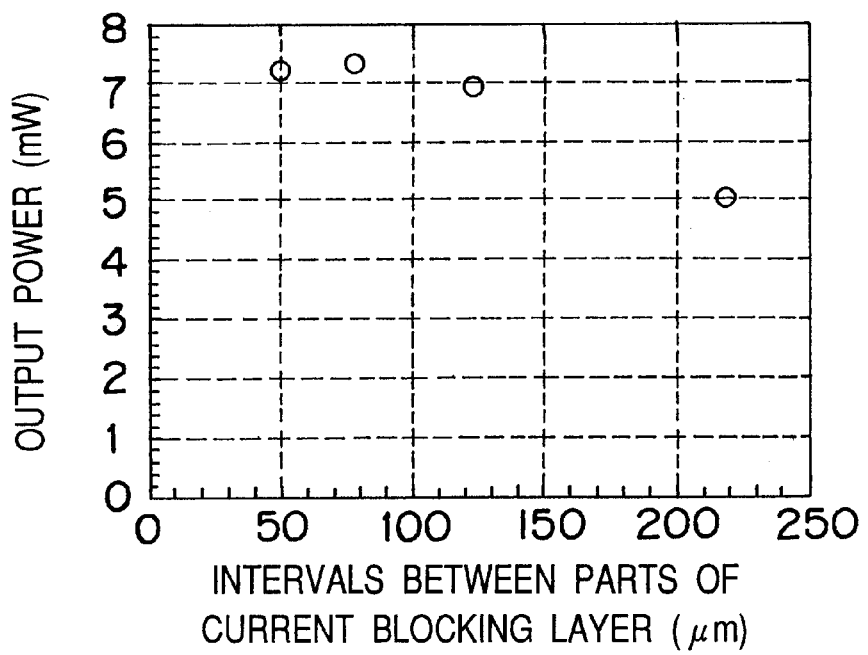
FIGS. 11A and 11B show the relationship between the configuration characteristic of a current blocking layer of the LED shown in FIG. 9 and the optical output power of the LED.
Figure 11B:
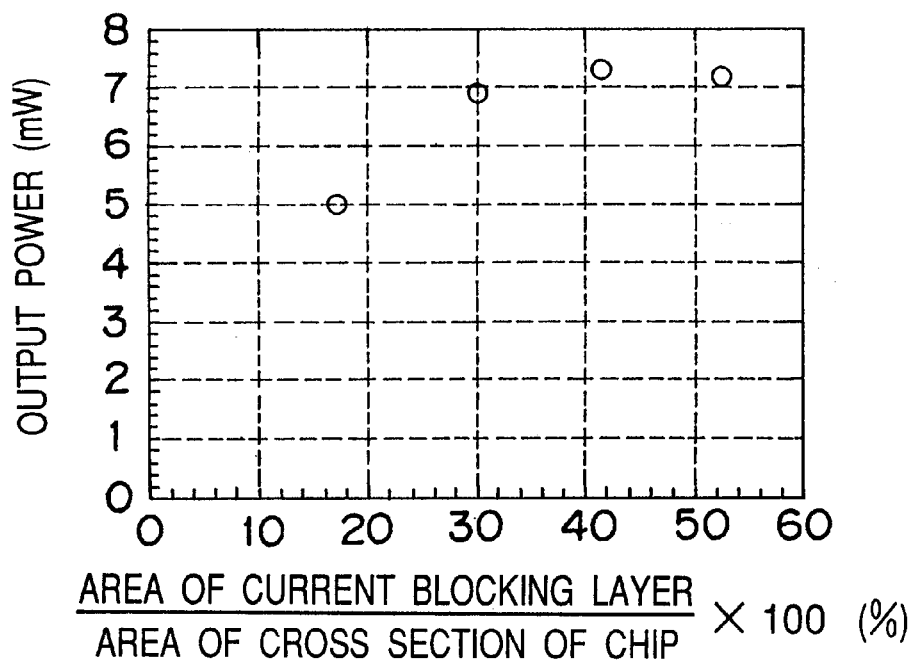

FIGS. 11A and 11B show the relationship between the configuration characteristics of the current blocking layer 89 and the optical power of the LED chip. The chip size is 560 μm×560 μm. The number of the short strips is two–five. FIG. 11A shows the relationship between the interval between adjacent parts (namely, adjacent short strips) of the current blocking layer 89 and the optical power of the LED chip when electric current of 100 mA is passed through the LED chip. FIG. 11A indicates that when the interval between adjacent blocking short strips is 80 μm, the optical power of the LED chip is the highest. Examining the distribution of the light emission intensity on the LED chip reveals that the light emission intensity attenuates by 90% at a position spaced about 80 μm from a short strip. Current diffusion can be considered to correspond to the light emission intensity. Accordingly, the light-emitting efficiency of the LED chip becomes maximum when the interval between two adjacent short strips of the current blocking layer 89 is set to a value equivalent to a distance to the position at which the current intensity attenuates by 90%.

FIG. 11B shows the relationship between the percentage of the area of the current blocking layer 89 to the sectional area of the LED chip and the optical power of the LED chip when electric current of 100 mA flows therethrough. FIG. 11B indicates that it is desirable to set the area of the current blocking layer 89 to 30% or more of the sectional area of the LED chip.

As described above, the current blocking layer 89 of the fourth embodiment has the planar configuration in which short strips each having a predetermined width are arranged at regular intervals and they are connected to each other at one end thereof with another short strip. The intervals between the adjacent short strips are set to values equal to or shorter than the distance from one short strip to the position at which the current intensity attenuates by 90%. The p-side electrode 93 is shaped to have a planar configuration in which short strips each having a predetermined width shorter than that of the current blocking layer 89 strips are arranged at predetermined intervals and connected to each other at one end thereof with another short strip. The p-side electrode 93 is formed immediately above the current blocking layer 89.

When the LED is used at a large current, the current density will become too high. Consequently, the optical power of the LED chip will saturate and its performance and characteristics will deteriorate due to passage of electrical current. But according to the fourth embodiment, the attenuation rate of the intensity of electric current flowing the second p-type current diffusion layer 90 is set at 90% or more. Thus, it is possible to obtain a favorable current diffusion. That is, the LED of the fourth embodiment is constructed such that the current density is prevented from becoming too high in using electric current of about 100 mA, which is much greater than several milliamperes to 50 mA which has been used hitherto. Thus, it is possible to improve the light-emitting characteristic of the LED.

The distance at which the light emission strength attenuates by 90% changes according to the thickness and dope density of the second p-type current diffusion layer 90. Therefore, it is necessary to optimally set the interval between the adjacent short strips of the current blocking layer 89, according to the changeable distance at which the light emission intensity attenuates by 90%.

Fifth Embodiment

Figure 12:
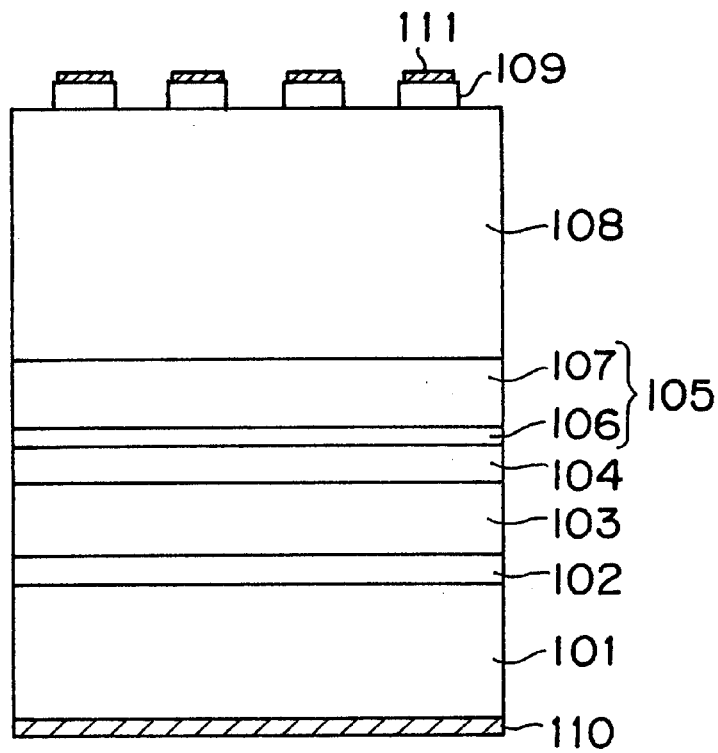
FIG. 12 is a vertical sectional view showing an LED of a fifth embodiment of the present invention.

FIG. 12 is a vertical sectional view showing an AlGaInP LED having an improved light-emitting characteristic when it is used at a large current owing to its construction different from that of the fourth embodiment. The structure of each layer is as follows:

Substrate 101:
  made of n-type GaAs
Buffer layer 102:
  made of n-type GaAs

N-type cladding layer 103:
  made of n-type $(Ga_{0.3}Al_{0.7})_{0.5}In_{0.5}P$
  impurity: Si, impurity concentration: $1\times10^{18}$ cm$^{-3}$, and
  thickness: 1 µm
Light-emitting layer 104:
  made of p-type $(Ga_{0.7}Al_{0.3})_{0.5}In_{0.5}P$
  thickness: 0.5 µm
First p-type cladding layer 106:
  made of p-type $(Ga_{0.5}Al_{0.5})_{0.5}In_{0.5}P$
  impurity: Zn, impurity concentration: $1\times10^{17}$ cm$^{-3}$, and
  thickness: 0.2 µm
Second p-type cladding layer 107:
  made of p-type $Al_{0.5}In_{0.5}P$
  impurity: Zn, impurity concentration: $5\times10^{17}$ cm$^{-3}$, and
  thickness: 1.0 µm
P-type current diffusion layer 108:
  made of p-type $Al_{0.01}Ga_{0.98}In_{0.01}P$
  impurity: Zn, impurity concentration: $1\times10^{18}$ cm$^{-3}$, and
  thickness: 7 µm
Contact layer 109:
  made of a p-type GaAs An n-side electrode 110 is formed on the underside of the n-type GaAs substrate 101. A p-side electrode 111 is formed on the p-type GaAs contact layer 109. An LED wafer thus grown/formed is used by dividing it into chips of 560 µm×560 µm.

Figure 13:
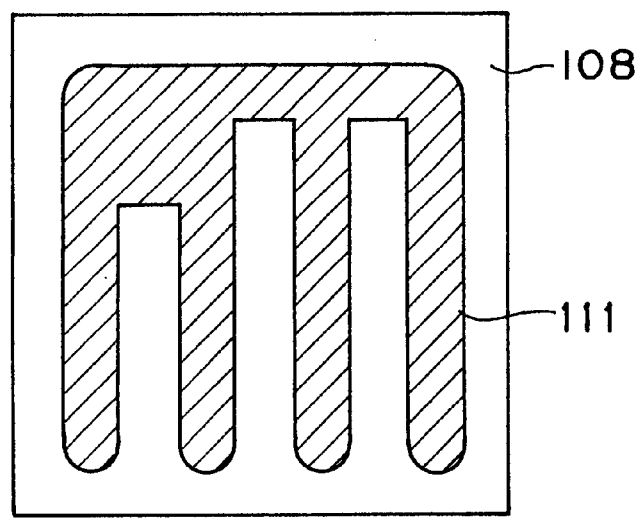
FIG. 13 is a plan view of the LED shown in FIG. 12.

FIG. 13 shows the LED as viewed from above. The p-side electrode 111 has a planar configuration in which short strips each having a width of 60 µm are arranged at regular intervals of 80 µm and connected to each other at one end thereof with another short strip having the width of 60 µm. Although the LED of the fifth embodiment does not have the current blocking layer unlike the third embodiment, the interval between adjacent branch electrodes (short strips) of the p-side electrode 111 is set to a value equal to or shorter than the distance at which the current intensity attenuates by 90%. In this case as well, it is possible to improve the light-emitting characteristic of the LED when it is used at a large current of about 100 mA.

Sixth Embodiment

Figure 14:
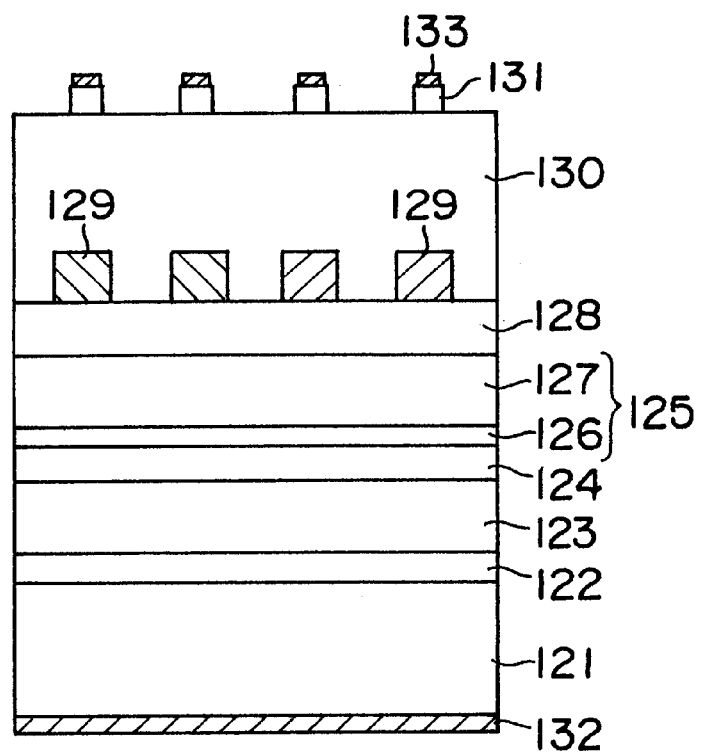
FIG. 14 is a vertical sectional view showing an LED of a sixth embodiment of the present invention.

FIG. 14 is a vertical sectional view showing an AlGaInP LED having improved light-emitting characteristic when it is used at a large current owing to its construction different from that of the fourth and fifth embodiments. In the LED, as in the case of the LED of FIG. 9, the following layers are sequentially provided on the n-type Gals substrate 121: an n-type GaAs buffer layer 122, an n-type $(Ga_{0.3}Al_{0.7})_{0.5}In_{0.5}P$ cladding layer 123, a p-type $(Ga_{0.7}Al_{0.3})_{0.5}In_{0.5}P$ light-emitting layer 124, a p-type $(Ga_{0.5}Al_{0.5})_{0.5}In_{0.5}P$ first cladding layer 126, a p-type $Al_{0.5}In_{0.5}P$ second cladding layer 127, a p-type $Al_{0.01}Ga_{0.98}In_{0.01}P$ first current diffusion layer 128, and an n-type $Al_{0.01}Ga_{0.98}In_{0.01}P$ current blocking layer 129.

Then, the n-type current blocking layer 129 is partly removed to form a current blocking structure. Then, a p-type $Al_{0.01}Ga_{0.98}In_{0.01}P$ second current diffusion layer 130 is formed on the n-type current blocking layer 129. A p-type GaAs contact layer 131 and a p-side electrode 133, which has a shape analogous to the current blocking layer 129, are formed on the second current diffusion layer 130 at a part positioned immediately above the current blocking layer 129. An n-side electrode 132 is formed on the underside of the n-type GaAs substrate 121.

Figure 15A:
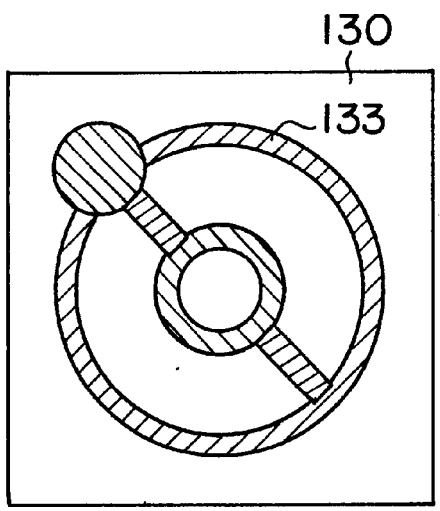
FIGS. 15A and 15B are plan views of the LED shown in FIG. 14 in which layers are formed up to a current blocking structure and layers are formed up to a p-side electrode, respectively.
Figure 15B:
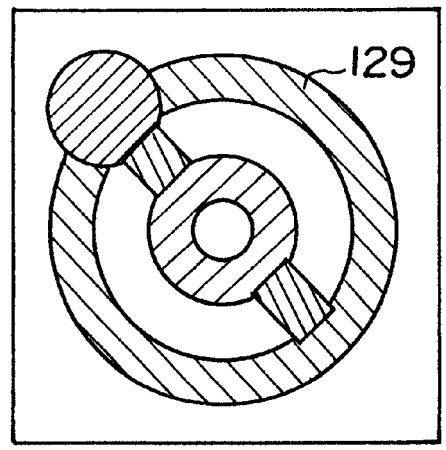

FIGS. 15A and 15B show the LED, as viewed from above, in a state in which the n-type GaAs buffer layer 122 through the current blocking structure have been formed, and in a state in which the n-type GaAs buffer layer 122 through the p-side electrode 133 are formed, respectively. FIG. 15A shows a planar configuration of the p-side electrode 133. FIG. 15B shows a planar configuration of the current blocking layer 129. As shown in FIG. 15A, the p-side electrode 133 has a planar configuration in which a plurality of concentric circular electrodes are connected to each other with a connection electrode. As shown in FIG. 15B, the current blocking layer 129 has a planar configuration in which a plurality of concentric circular blocking parts are connected to each other with a connection. The width of each circular electrode of the p-side electrode 133 is 30 µm. The interval between the adjacent circular electrodes of the p-side electrode 133 is 110 µm. The width of each circular blocking part of the current blocking layer 129 is 60 µm. The interval between the adjacent circular blocking parts is 80 µm. Under these conditions, the optical power of the LED of the sixth embodiment is almost the same as that of the LED of the fourth embodiment. That is, when the LED is used at a large current, the effect of improving the light-emitting characteristic, which is brought about by the improvement of the p-side electrode and the current blocking layer, is determined not by the shapes of the p-side electrode and the current blocking layer, but by the widths of the electrode and the blocking layer and the intervals between the parts of the electrode and between the parts of the current blocking layer.

Figure 16A:
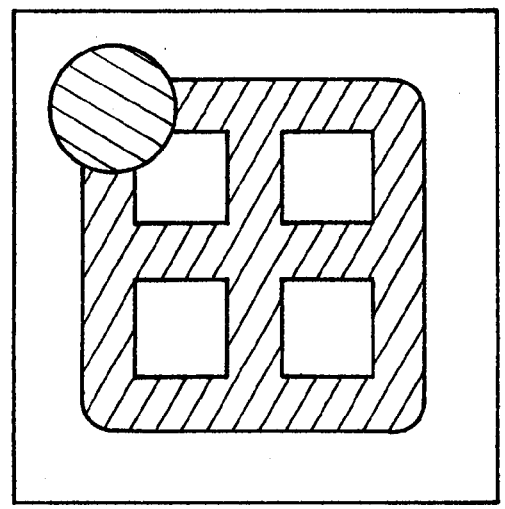
FIGS. 16A, 16B, and 16C each show a planar configuration of a p-side electrode or that of a current blocking layer different from those shown in FIGS. 2, 8, 10, 13, and 15.
Figure 16B:
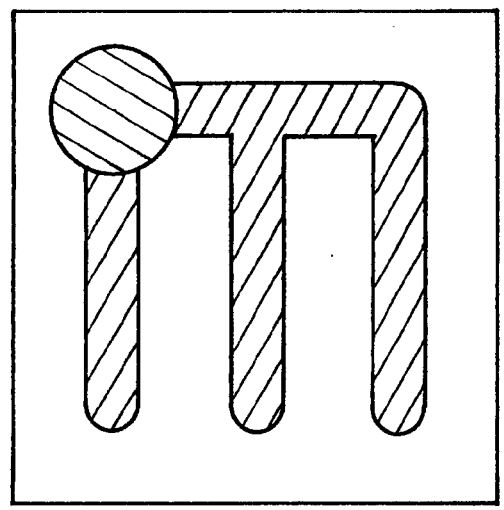
Figure 16C:
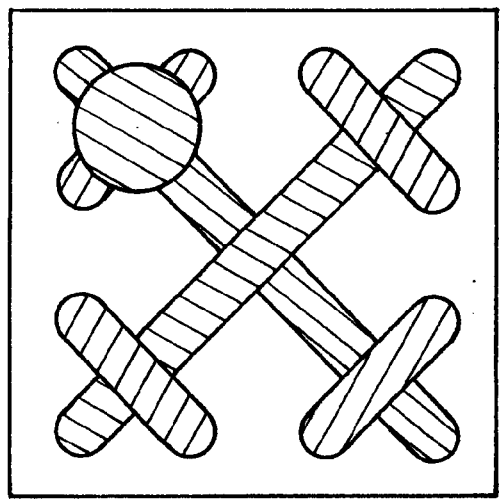
Figure 17A:
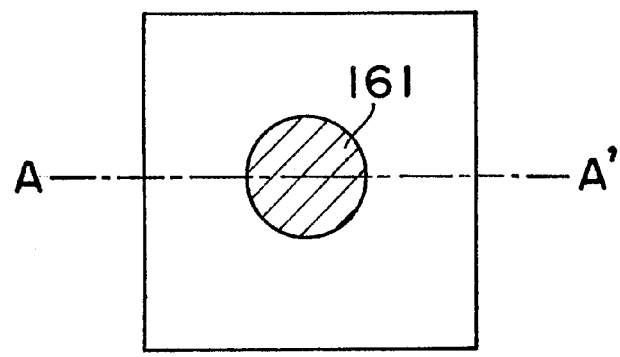
FIGS. 17A and 17B are a plan view and a graph, respectively, for describing a distance Ld from a p-side electrode to a location at which an optical power attenuates by 90%.
Figure 17B:
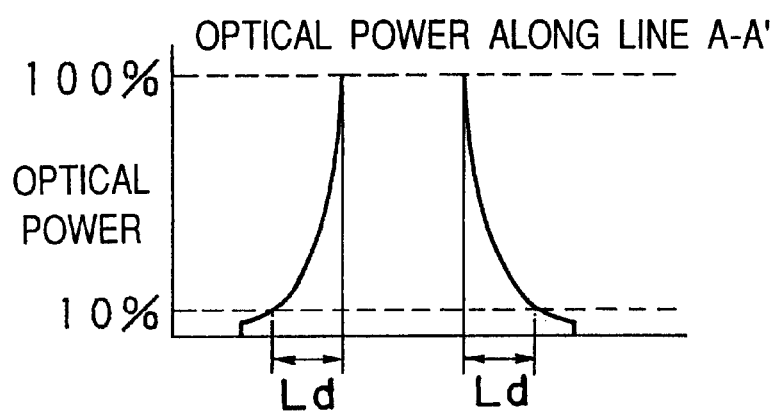
Figure 18:
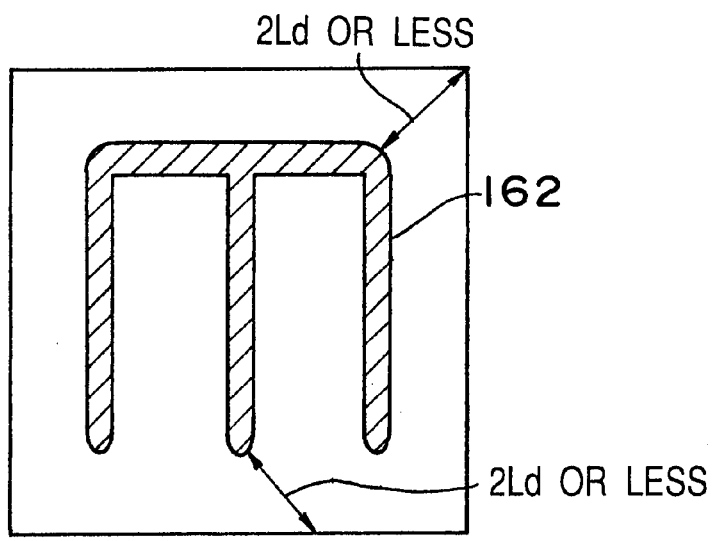
FIG. 18 is an explanatory view showing the p-side electrode present at a distance of 2 Ld or less from any given point on an LED chip.
Figure 19A:
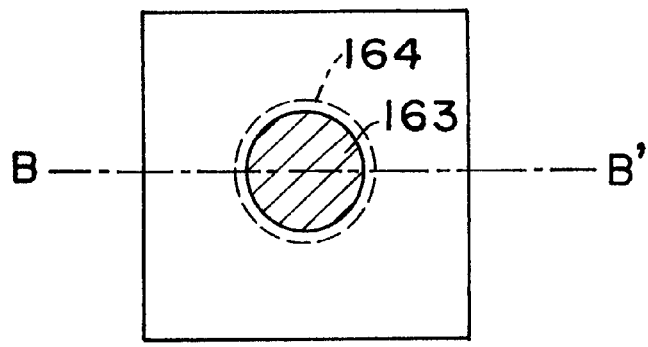
FIGS. 19A and 19B are a plan view and a graph, respectively, for describing a distance Ld from a current blocking layer to a location at which an optical power attenuates by 90%.
Figure 19B:
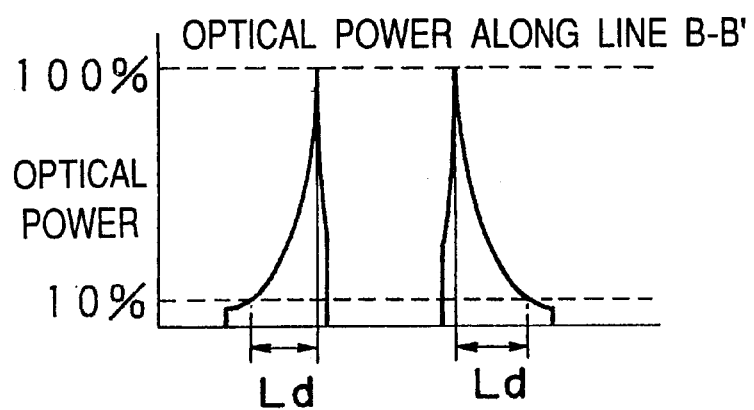
Figure 20:
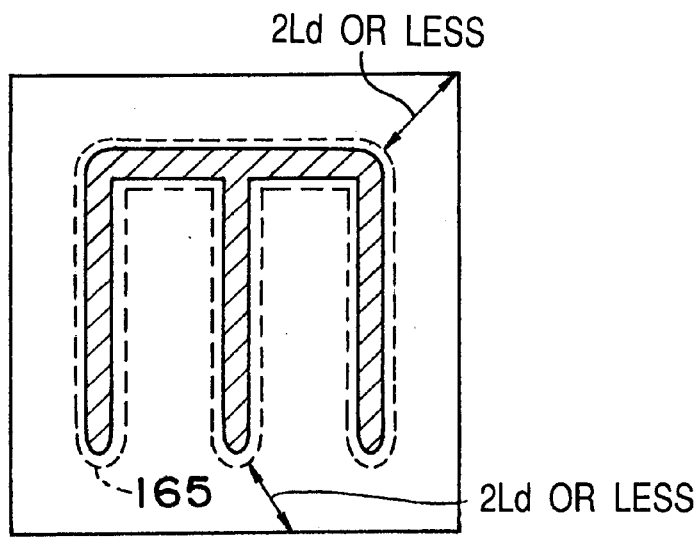
FIG. 20 is an explanatory view for explaining a current blocking layer present at a distance of 2 Ld or less from any given point on an LED chip.
Figure 21:
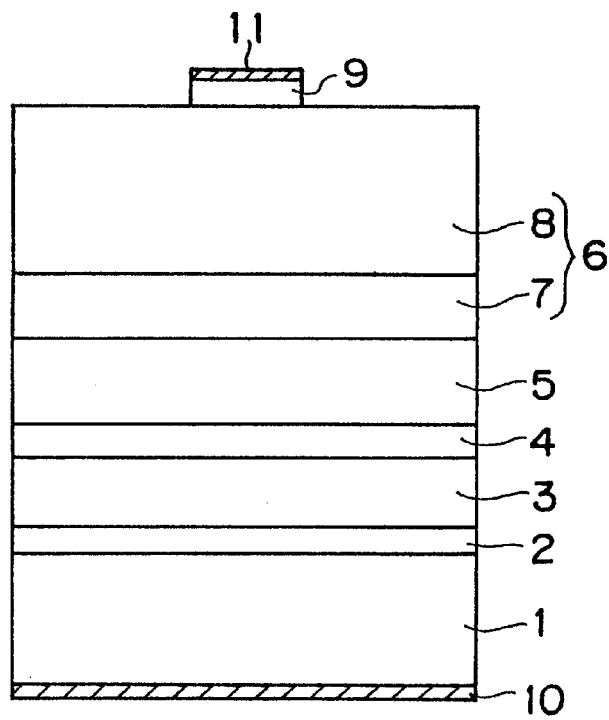
FIG. 21 is a vertical sectional view showing a conventional LED having a double hetero-structure.
Figure 22:
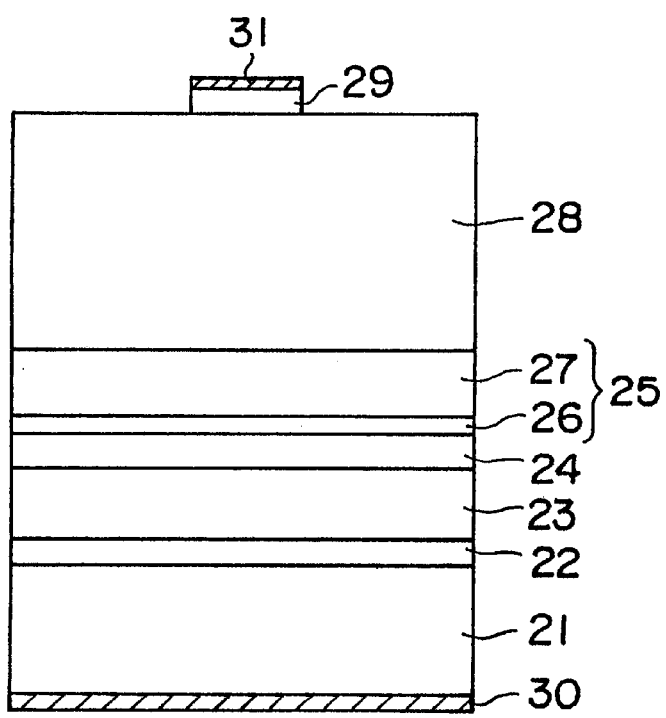
FIG. 22 is a vertical sectional view showing an LED as a background art.
Figure 23:
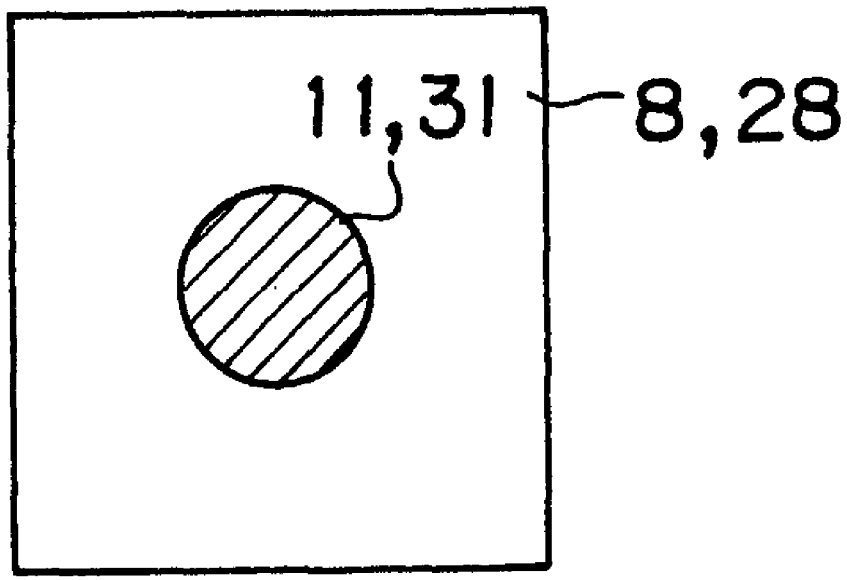
FIG. 23 shows a planar configuration of a p-side electrode shown in FIGS. 21 and 22.

Accordingly, the planar shape of the p-side electrode and that of the current blocking layer of the present invention are not limited to those shown in FIGS. 10, 13, and 15. A high light-emitting efficiency is also obtainable even by adopting shapes shown in FIGS. 16A–16C.

Needless to say, the size of the LED chip of the present invention is not limited to 560 µm×560 µm. In each embodiment, the n-type cladding layer is formed as a single layer, but may be formed as a two-layer structure consisting of first and second n-type cladding layers. In this case, an n-type cladding layer closer to the light-emitting layer may be used as the barrier layer to prevent the diffusion of the n-type impurity to the light-emitting layer. Thereby, it is possible to obtain an LED having higher reliability.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting diode of a double hetero-junction type comprising:
   a light-emitting layer composed of a GaAlInP material;
   a p-type cladding layer and an n-type cladding layer sandwiching said light-emitting layer therebetween;
   a p-side electrode formed on the p-type cladding layer side; and
   an n-side electrode formed on the n-type cladding ladder side;
   said p-type cladding layer including a first p-type cladding layer positioned closer to said light-emitting layer and having a lower aluminum content and a lower impurity concentration, and a second p-type cladding layer positioned farther from said light-emitting layer and having a higher aluminum content and a higher impurity concentration; and
   a current blocking layer for locally blocking electric current flowing from said p-side electrode to said n-side electrode.

2. A light emitting diode according to claim 1, wherein a thickness of said first p-type cladding layer is 0.2 µm or more, but 0.5 µm or less.

3. A light emitting diode according to claim 1, wherein said p-side electrode has an electrode window consisting of an opening; and said current blocking layer has an opening at a position confronting said electrode window of said p-side electrode, and said opening of the current blocking layer serves as a current path for intensively passing electric current from said p-side electrode through the light emitting diode.

4. A light emitting diode according to claim 1, wherein said p-side electrode is formed at a central portion of a surface; and said current blocking layer is formed at a position confronting said p-side electrode such that electric current coming from said p-side electrode flows around said current blocking layer.

5. A light emitting diode according to claim 1, further comprising a current diffusion layer, and wherein said current is blocking layer is formed within the current diffusion layer.

* * * * *